(12) United States Patent
Takabatake et al.

(10) Patent No.: US 11,955,360 B2
(45) Date of Patent: Apr. 9, 2024

(54) ELECTROSTATIC CHUCK AND PROCESSING APPARATUS

(71) Applicants: TOCALO Co., Ltd., Kobe (JP); HITACHI HIGH-TECH CORPORATION, Tokyo (JP)

(72) Inventors: Takeshi Takabatake, Akashi (JP); Tomohiro Nakasuji, Akashi (JP); Akira Itoh, Akashi (JP); Kentaro Seto, Fukuoka (JP); Yutaka Omoto, Tokyo (JP); Hiroho Kitada, Tokyo (JP); Kazuumi Tanaka, Tokyo (JP)

(73) Assignees: TOCALO CO., Ltd., Kobe (JP); HITACHI HIGH-TECH CORPORATION, Tokyo (JP)

(*) Notice: Subject to any disclaimer, the term of this patent is extended or adjusted under 35 U.S.C. 154(b) by 216 days.

(21) Appl. No.: 17/642,083

(22) PCT Filed: Dec. 24, 2020

(86) PCT No.: PCT/JP2020/048578
§ 371 (c)(1),
(2) Date: Mar. 10, 2022

(87) PCT Pub. No.: WO2022/137467
PCT Pub. Date: Jun. 30, 2022

(65) Prior Publication Data
US 2023/0154780 A1 May 18, 2023

(51) Int. Cl.
*H01L 21/683* (2006.01)
*H01J 37/32* (2006.01)
*H01L 21/687* (2006.01)

(52) U.S. Cl.
CPC .... *H01L 21/6833* (2013.01); *H01J 37/32715* (2013.01); *H01L 21/68757* (2013.01)

(58) Field of Classification Search
CPC .............. H01L 21/683; H01L 21/6831; H01L 21/6833; H01L 21/68757; H01J 37/32715
(Continued)

(56) References Cited

U.S. PATENT DOCUMENTS

| 5,607,541 A | 3/1997 | Kubota et al. |
| 5,792,562 A | 8/1998 | Collins et al. |

(Continued)

FOREIGN PATENT DOCUMENTS

| JP | H06-000737 A | 1/1994 |
| JP | H08-274151 A | 10/1996 |

(Continued)

OTHER PUBLICATIONS

Machine translation of Nishimoto Japanese Patent Document JP 2004-55909 A Feb. 2004 (Year: 2004).*

(Continued)

*Primary Examiner* — Kevin J Comber
(74) *Attorney, Agent, or Firm* — Faegre Drinker Biddle & Reath LLP

(57) ABSTRACT

A Johnsen-Rahbek force type electrostatic chuck including: a metal substrate; an electrode for electrostatic attraction provided on the metal substrate with an insulating layer interposed between the metal substrate and the electrode for electrostatic attraction; and a dielectric layer constituting an electrostatic attraction surface in contact with a workpiece. The dielectric layer includes a ceramic spray coating and a sealing component with which pores of the ceramic spray coating are filled, and the sealing component contains a metal organic salt containing a rare earth element.

8 Claims, 10 Drawing Sheets

(58) Field of Classification Search
USPC .......................................................... 361/234
See application file for complete search history.

(56) References Cited

U.S. PATENT DOCUMENTS

| 5,909,354 | A | * | 6/1999 | Harada | ............... | H01L 21/6833 |
| | | | | | | 279/128 |
| 2004/0216667 | A1 | * | 11/2004 | Mitsuhashi | ......... | C23C 16/4404 |
| | | | | | | 118/715 |

FOREIGN PATENT DOCUMENTS

| JP | H09-069554 | A | | 3/1997 |
| JP | 2002-083861 | A | | 3/2002 |
| JP | 2002083861 | A | * | 3/2002 |
| JP | 2004-055909 | A | | 2/2004 |
| JP | 2004055909 | A | * | 2/2004 |
| JP | 2004-190136 | A | | 7/2004 |
| JP | 2004-260159 | A | | 9/2004 |

OTHER PUBLICATIONS

Machine translation of Ogura et al. Japanese Patent Document JP 2002-83861 A Mar. 2002 (Year: 2002).*

* cited by examiner (a)

(b)

(a)

MASS SPECTRUM OF DETECTED PEAK 3

(b)

MASS SPECTRUM OF DETECTED PEAK 4

(c)

DETECTED PEAK 3 DATABASE SEARCH RESULT (d)

DETECTED PEAK 4 DATABASE SEARCH RESULT (e)

METHYL ABIETATE DATABASE SEARCH RESULT

ELECTROSTATIC CHUCK AND PROCESSING APPARATUS

TECHNICAL FIELD

The present invention relates to an electrostatic chuck and a processing apparatus including the electrostatic chuck.

BACKGROUND ART

In a manufacturing process of a semiconductor device, an electrostatic chuck is used to hold a semiconductor wafer. As the electrostatic chuck, for example, there is known an electrostatic chuck in which a chuck electrode is provided on a metal mounting table with an insulating layer interposed therebetween, a ceramic dielectric layer is further laminated so as to cover the chuck electrode, and the surface of the dielectric layer serves as an electrostatic attraction surface for holding a semiconductor wafer.

The electrostatic chuck is disposed, for example, in a plasma processing apparatus such as a plasma etching; apparatus. The electrostatic attraction surface of the electrostatic chuck disposed in the plasma processing apparatus is required to have corrosion resistance against a plasma gas and a cleaning liquid. This is because the electrostatic chuck is repeatedly used.

For example, in the plasma etching apparatus, a cleaning step is performed for each semiconductor wafer or for each lot so as to remove a reaction product generated from a processing target material attached to the inner wall of an etching chamber. In this cleaning step, for example, plasma cleaning using halogen such as fluorine (F) or a mixed gas containing halogen is performed. At this time, the electrostatic attraction surface of the electrostatic chuck is also exposed to the plasma gas used for plasma cleaning.

Therefore, it has been proposed to provide a protective layer for preventing corrosion due to a plasma gas (including the plasma gas used in the cleaning step) or a cleaning liquid on the electrostatic attraction surface of the electrostatic chuck disposed in the plasma processing apparatus. As means for forming the protective layer, for example, physical vapor deposition (PVD), chemical vapor deposition (CVD), thermal spraying, coating, or the like is used Among them, the thermal spraying capable of forming a coating of ceramic (e.g., yttria) with a thickness of about several 100 μm is suitable as means for forming a protective layer having high corrosion resistance.

Meanwhile, the coating formed by the thermal spraying often has pores, and a post-treatment called a sealing treatment may be performed to close the pores. In the sealing treatment, an organic resin such as an epoxy resin is often used, but there is also a method of applying a coating material containing an inorganic component and then volatilizing a solvent component to fill the pores with the inorganic component (e.g., see Patent Literatures 1 and 2).

Here, when the sealing component filling the pores of the spray coating as the protective layer disappears, the inside of the dielectric layer is exposed to the plasma gas, which may affect the characteristics of the dielectric layer. For example, the dielectric layer adheres onto the semiconductor wafer due to cracking or wear of the dielectric layer, and as a result, the yield of the semiconductor wafer may be reduced, or the electrical characteristics of the dielectric layer itself may be impaired to cause attraction failure.

CITATION LIST

Patent Literature

PATENT LITERATURE 1: Japanese Laid-Open Patent Publication No. 2004-190136
PATENT LITERATURE 2: Japanese Laid-Open Patent Publication No. 2004-260159

SUMMARY OF THE INVENTION

Technical Problem

The electrostatic chuck can be classified into several types such as a Johnsen-Rahbek force type and a Coulomb force type depending on a difference in an electrostatic attraction mechanism, and depending on the type, a dielectric layer having high corrosion resistance may not be formed on the electrostatic attraction surface.

For example, a coating of yttria has a large volume resistivity and thus cannot be used as a dielectric layer of the Johnsen-Rahbek force type electrostatic chuck through which a small amount of current flows on the outermost surface.

As a method of forming a dielectric layer having high corrosion resistance on the electrostatic attraction surface of the Johnsen-Rahbek force type electrostatic chuck, a method of forming a dielectric layer by the thermal spraying using spray material with low volume resistivity and excellent corrosion resistance is considered. However, at present, a spray material capable of achieving the method has not been found.

As another method, a method of forming a ceramic spray coating by use of a spray material inferior in corrosion resistance but low in volume resistivity, and then performing a sealing treatment using a sealing treatment agent having high corrosion resistance is also considered. With this method, it can be expected to form a dielectric layer having high corrosion resistance without significantly changing the electrical characteristics of the electrostatic attraction surface.

However, as in Patent Literatures 1 and 2, when the pores of the ceramic spray coating are to be sealed with yttria by the sol-gel method, it is necessary to perform heat treatment at a high temperature (e.g., a temperature of 500° C. or higher) until an organic component disappears, so that a large crack may occur in the ceramic spray coating due to a difference in thermal expansion between the ceramic spray coating and the metallic mounting table constituting the electrostatic chuck, and the ceramic spray coating may no longer function as the dielectric layer.

In addition, a method of forming a ceramic spray coating by use of a spray material inferior in corrosion resistance but low in volume resistivity, and then forming a coating having corrosion resistance of about several microns by PVD or CVD so as to cover the entire surface of the ceramic spray coating instead of the sealing treatment is also considered.

However, also in this method, due to the heat during the processing by PVD or CVD, a crack may occur in the ceramic spray coating due to a difference in thermal expansion between the ceramic spray coating and the metal mounting table constituting the electrostatic chuck.

As described above, it has been difficult to form a dielectric layer having low volume resistivity and high corrosion resistance on the electrostatic attraction surface of the Johnsen-Rahbek force type electrostatic chuck.

[Solution to Problem]

The present inventors have conducted intensive studies in order to solve the above problems and have found that the use of a new sealing component makes it possible to provide a Johnsen-Rahbek force type electrostatic chuck including a layer having low volume resistivity and high corrosion resistance as a dielectric layer constituting an electrostatic attraction surface, thus completing the present invention.

(1) An electrostatic chuck of the present invention is a Johnsen-Rahbek force type electrostatic chuck including: a metal substrate; an electrode for electrostatic attraction provided on the metal substrate with an insulating layer interposed between the metal substrate and the electrode for electrostatic attraction; and a dielectric layer constituting an electrostatic attraction surface in contact with a workpiece. The dielectric layer includes a ceramic spray coating and a sealing component with which pores of the ceramic spray coating are filled, and the sealing component contains a metal organic salt containing a rare earth element.

The electrostatic chuck includes a dielectric layer containing a ceramic spray coating and a specific sealing component as the dielectric layer having the electrostatic attraction surface, and the dielectric layer is a layer having low volume resistivity and high corrosion resistance. Therefore, the electrostatic chuck is a Johnsen-Rahbek force type electrostatic chuck having excellent corrosion resistance.

(2) In the electrostatic chuck, it is preferable that a volume resistivity of the ceramic spray coating be $1.0 \times 10^8$ to $1.0 \times 10^{13} \Omega \cdot cm$.

In this case, it is possible to exhibit favorable electrostatic attraction performance as the Johnsen-Rahbek force type electrostatic chuck.

(3) In the electrostatic chuck, it is preferable that the ceramic spray coating be made of aluminum-titanium oxide.

This case is particularly suitable for achieving a volume resistivity suitable for the Johnsen-Rahbek force type electrostatic chuck.

(4) In the electrostatic chuck, it is preferable that the rare earth element be yttrium or ytterbium.

These cases are particularly suitable for making the dielectric layer highly corrosion resistant.

(5) The processing apparatus of the present invention includes the electrostatic chuck according to any one of (1) to (4).

Examples of the processing apparatus include a plasma processing apparatus. At this time, the electrostatic chuck included in the plasma processing apparatus is excellent in corrosion resistance (plasma resistance).

Advantageous Effects of the Invention

According to the present invention, it is possible to provide a Johnsen-Rahbek force type electrostatic chuck, in which an electrostatic attraction surface is excellent in corrosion resistance, and a processing apparatus including the electrostatic chuck.

BRIEF DESCRIPTION OF DRAWINGS

FIG. 6(a) and FIG. 6(b) are views each showing a distribution of fluorine in the coating of the electrostatic chuck for evaluation, in which FIG. 6(a) shows the analysis result of the region A, and FIG. 6(b) shows the analysis result of the region B.

DETAILED DESCRIPTION

Embodiments of the present invention will be described hereinafter with reference to the drawings.

First Embodiment

Here, an embodiment of the present invention will be described using a plasma processing apparatus as an example.

Figure 1:
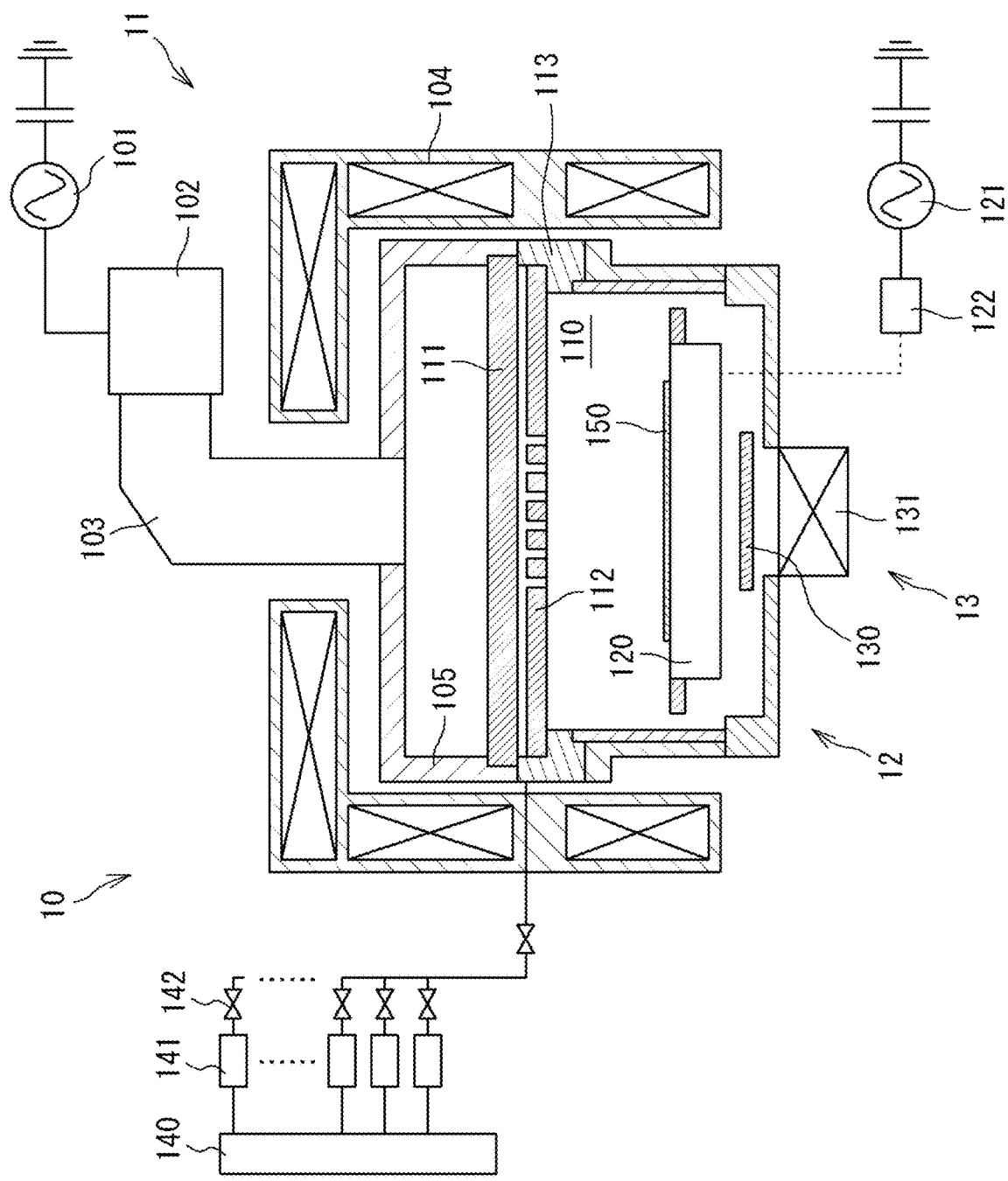
FIG. 1 is a longitudinal sectional view showing a schematic configuration of a plasma processing apparatus according to an embodiment of the present invention.

FIG. 1 is a longitudinal sectional view showing a schematic configuration of a plasma processing apparatus according to the present embodiment.

The processing apparatus shown in FIG. 1 is a plasma processing apparatus 10. The plasma processing apparatus 10 can be suitably used as, for example, a plasma etching apparatus.

The plasma processing apparatus 10 roughly includes three portions. Specifically, the plasma processing apparatus 10 includes a plasma formation part 11, a vacuum vessel 12, and an exhaust system 13.

The plasma formation part 11 includes a microwave source 101, a waveguide 103, and a solenoid coil (static magnetic field generator) 104. The microwave source 101 is connected to the ground via a power source, and a load impedance can be adjusted by an adjacent automatic matcher 102 to automatically reduce a reflected wave. The waveguide 103 has a cross section changed from a square shape to a circular shape and transmits microwaves to a cylindrical cavity resonance part 105. The solenoid coil 104 is disposed so as to cover the upper side and the lateral side of the vacuum vessel 12, and the distribution of the static magnetic field can be controlled by changing a current applied to the electromagnet.

The vacuum vessel 12 includes a dielectric window (microwave introduction window) 111, a shower plate 112, a gas ring (gas introduction part) 113, and a plasma processing chamber 110. In the vacuum vessel 12, a desired reactive gas with its flow rate controlled by a mass flow controller 141 and a gas supply valve 142 is introduced from the gas source 140 to between the dielectric window (microwave introduction window) 111 and the shower plate 112 via the gas ring (gas introduction part) 113, and is supplied into the plasma processing chamber 110 via the shower plate 112.

The shower plate 112 is provided with a large number of holes at positions facing a semiconductor wafer 150 electrostatically attracted to the electrostatic chuck 120 and is configured to be able to supply the processing gas from the gas source 140 into the vacuum vessel 12.

The shower plate 112 is installed facing the electrostatic chuck 120 with a space therebetween.

The vacuum vessel 12 further includes an electrostatic chuck 120 in the lower portion in the plasma processing chamber 110.

The electrostatic chuck 120 has a disk shape, can adsorb and hold a semiconductor wafer (also simply referred to as a wafer in the present specification) 150 as a workpiece by static electricity, and can control the temperature of the wafer 150. Further, a radio frequency (RF) power source 121 is connected to a metal substrate 201 of the electrostatic chuck 120 via a matching device 122 and the electrostatic chuck 120 is configured to be able to apply RF to the wafer 150.

The exhaust system 13 includes a movable valve 130 and a turbomolecular pump (TMP) 131. The gas in the plasma processing chamber 110 is exhausted from the TMP 131. The movable valve 130 provided in the upstream portion of the TMP controls the exhaust speed of the gas to be exhausted, thereby controlling the pressure in the plasma processing chamber 110.

Figure 2:
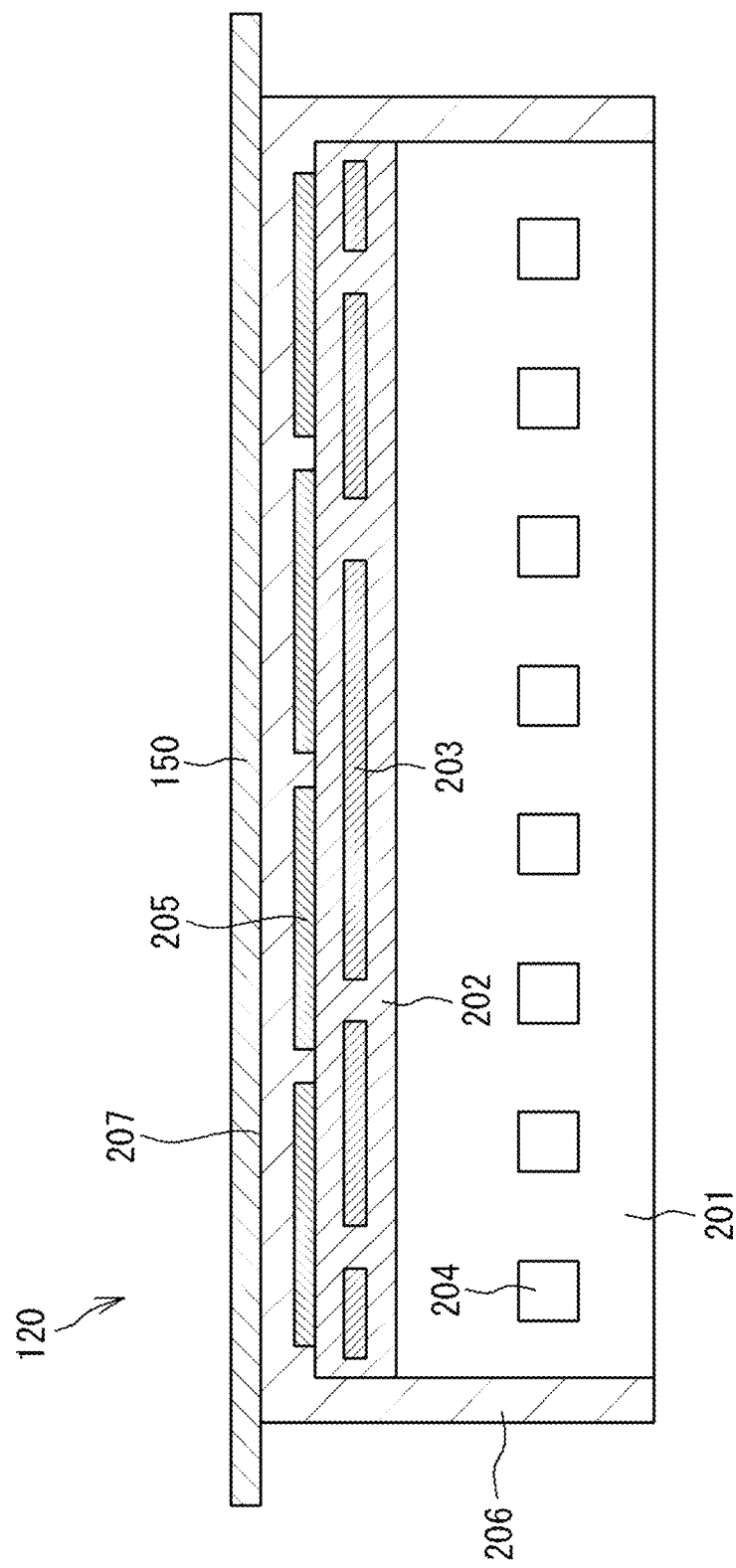
FIG. 2 is a longitudinal sectional view of an electrostatic chuck included in the plasma processing apparatus of FIG. 1.

The structure of the electrostatic chuck 120 will be described in detail with reference to FIG. 2, FIG. 2 is a longitudinal sectional view of an electrostatic chuck included in the plasma processing apparatus 10 of FIG. 1.

The electrostatic chuck 120 includes a metal substrate 201 made of metal, an insulating layer 202 disposed on the upper surface of the metal substrate 201, a chuck electrode (electrode for electrostatic attraction) 205 disposed on the insulating layer 202, and a dielectric layer 206 provided so as to cover the chuck electrode 205.

The insulating layer 202 includes a heater (heater layer) 203 therein. The heater 203 is energized and heated by a heater direct current (DC) power source (not shown).

The dielectric layer 206 has an electrostatic attraction surface 207 in contact with a wafer 150. The dielectric layer 206 is provided so as to cover the upper surface and the side surface of the electrostatic chuck 120 and also functions as a protective layer of the electrostatic chuck 120.

Inside the electrostatic chuck 120 (metal substrate 201), flow paths (refrigerant grooves) 204 are disposed concentrically or spirally. A refrigerant having a temperature and a flow rate (flow velocity) adjusted by a temperature control unit (not shown) is introduced into the flow path 204.

A heat transfer gas flow path (not show is provided between the dielectric layer 206 of the electrostatic chuck 120 and the back surface of the wafer 150. The heat transfer gas flow path is formed of a groove provided on the surface of the dielectric layer 206 and a semiconductor wafer, and the groove functions as a gas flow path. A gas having a heat transfer property such as He is supplied from a heat transfer gas supply source to the heat transfer gas flow path.

In the electrostatic chuck 120, a DC voltage chuck voltage) is applied to the chuck electrode 205 by using a DC power source (not shown) to generate a Johnsen-Rahbek force, and the semiconductor wafer 150 can be adsorbed and held on the electrostatic attraction surface 207 of the electrostatic chuck 120.

The metal substrate 201 is made of, for example, titanium, aluminum, molybdenum, tungsten, an alloy containing at least one of these, or the like. When an aluminum metal substrate is used, for example, the surface may be subjected to alumite treatment.

The insulating layer 202 is made of, for example, aluminum oxide ($Al_2O_3$) or the like. The insulating layer 202 is, for example, a spray coating formed by thermal spraying. The insulating layer 202 may be formed of one spray coating or may be formed of two or more spray coatings.

The dielectric layer 206 includes a ceramic spray coating and a sealing component with which pores of the ceramic spray coating are filled. The sealing component prevents moisture in the atmosphere and a reaction product generated during the etching process from entering the pores in the spray coating or microcracks generated during the surface polishing.

The sealing treatment for filling the pores of the ceramic spray coating with the sealing component is performed, for example, by applying a sealing agent to the surface of the ceramic spray coating, impregnating the surface with the sealing agent for a certain period of time, and then performing heat treatment to volatilize the solvent component in the sealing agent.

The ceramic spray coating constituting the dielectric layer 206 is, for example, a coating made of aluminum-titanium oxide.

It is preferable that the aluminum-titanium oxide contain 2.0 to 12.0 wt % of titanium oxide and the rest be aluminum oxide.

The dielectric layer 206 may be formed of one spray coating or may be formed of two or more spray coatings.

The thickness of the insulating layer 202 is, for example, about 200 to 500 μm.

The thickness of the dielectric layer 206 is, for example, about 100 to 500 μm.

The volume resistivity of the ceramic spray coating constituting the dielectric layer 206 is preferably $1.0 \times 10^8$ to $1.0 \times 10^{13} \Omega \cdot cm$.

This range is a volume resistivity suitable for electrostatically attracting the workpiece by the Johnsen-Rahbek force.

When the volume resistivity is less than $1.0 \times 10^8 \Omega \cdot cm$, the amount of current flowing through the dielectric layer 206 becomes excessively large, and the electrostatic attraction performance by the Johnsen-Rahbek force is hardly exhibited. When the volume resistivity exceeds $1.0 \times 10^{13} \Omega \cdot cm$, the amount of current flowing through the dielectric layer 206 becomes excessively small, and the electrostatic attraction performance by the Johnsen-Rahbek force is hardly exhibited.

The ceramic spray coating containing 2.0 to 12.0 wt % of titanium oxide and the rest being aluminum oxide has a volume resistivity of $1.0 \times 10^8 \Omega \cdot cm$ to $1.0 \times 10^{11} \Omega \cdot cm$ and is thus suitable as the dielectric layer 206 of the Johnsen-Rahbek force type electrostatic chuck.

The sealing component contains a metal organic salt containing a rare earth element. The sealing component is preferably a solidified material containing the metal organic salt and a resin. In this case, the resin serves as a binder for holding the metal organic salt.

Such a solidified material is excellent in environment isolation property and prevents a cleaning liquid and a corrosive gas from entering the inside of the ceramic spray coating. The solidified material contains a metal organic salt containing a rare earth element, and the rare earth element is oxidized by the influence of oxygen plasma or the like at the time of using the plasma processing apparatus to form a rare earth oxide (yttria or the like). Therefore, a deterioration due to plasma hardly occurs, and a favorable sealed state can be maintained for a long period of time. As a result, the corrosion of the chuck electrode 205, the metal substrate 201, and the like is prevented, and corrosion resistance is excellent.

The sealing treatment for filling the pores of the ceramic spray coating with the solidified material can be performed at a low temperature of 200° C. or lower.

Therefore, it is possible to avoid the occurrence of cracking or the like in the ceramic spray coating due to a difference in thermal expansion between the metal substrate 201 and the ceramic spray coating when the sealing treatment is performed.

Furthermore, since the solidified material has little influence on the volume resistivity of the ceramic spray coating, it is possible to maintain electrical characteristics suitable for electrostatically attracting the workpiece by the Johnsen-Rahbek force of the ceramic spray coating.

In the metal organic salt containing a rare earth element, yttrium or ytterbium is preferable as the rare earth element. This is because these oxides have high corrosion resistance (plasma resistance).

Examples of the metal organic salt containing a rare earth element include salts of a carboxyl group-containing compound and a rare earth element-containing compound. Specific examples thereof include yttrium 2-ethylhexanoate, yttrium caprylate, yttrium decanoate, yttrium stearate, and yttrium naphthenate.

As described above, the sealing component is preferably a solidified material containing a resin from the viewpoint of improving the environment isolation property and corrosion resistance of the dielectric layer 206.

The resin may be either a natural resin or a synthetic resin. The natural resin is preferably a terpenoid. Among them, rosin mainly composed of a diterpene-based carboxylic acid, such as abietic acid or pimaric acid, is preferable. The reason for this is that the hydroxyl group contained in the diterpene-based carboxylic acid has high affinity with the oxide ceramic, so that the adhesion between the ceramic spray coating and the sealing component is improved to make the environment isolation property excellent.

The content of the metal organic salt containing a rare earth element in the sealing component is preferably 20 wt % or more. When the content of the metal organic salt is less than 20 wt %, a rare earth oxide may not be sufficiently formed. The content of the metal organic salt is more preferably 40 wt % or more from the viewpoint of further excellent corrosion resistance.

The content of the resin in the sealing component is preferably 10 wt or more, and when the content is less than 10 wt %, the sealing may not be sufficient. The content is more preferably 40 wt % or more, and an excellent environment isolation property can be obtained.

The dielectric layer 206 having such a configuration can be formed, for example, by the following method.

(1) A spray material such as aluminum-titanium oxide is sprayed on the insulating layer 202 so as to cover the chuck electrode 205 to form a ceramic spray coating made of a metal oxide and having pores.

At this time, the spraying method is not particularly limited, and for example, plasma spraying, flame spraying, or the like cats be adopted.

(2) Separately from the step (1), a metal organic salt containing the rare earth element is prepared, diluted with a resin oil, and further added with an organic solvent to adjust the concentration so as to have an appropriate viscosity.

Here, examples of the organic solvent include acetic acid esters.

Examples of the Resin Oil Include Turpentine Oil (3) The solution prepared in the step (2) is applied to the ceramic spray coating formed in the step (1), and the solution is allowed to permeate the pores of the ceramic spray coating.

(4) Thereafter, for example, a heat treatment is performed at a heating temperature of 120 to 200° C. to volatilize a part or the whole of the organic solvent, thereby baking and solidifying the sealing agent.

Through the steps as thus described, the pores of the ceramic spray coating are filled with a sealing component formed of a solidified material in which a metal organic salt containing a rare earth element and a resin containing rosin are mixed, and the dielectric layer 206 containing the ceramic spray coating and the sealing component can be formed.

Next, a processing method using the plasma processing apparatus 10 will be described.

First, the semiconductor wafer 150 is loaded into the vacuum vessel 12 from a loading port (not shown), placed on the electrostatic chuck 120, and the loading port is closed. Next, the gas in the plasma processing chamber 110 is exhausted by the TMP 131 while the exhaust speed is adjusted by the movable valve 130.

Thereafter, a DC voltage is applied from a DC power source (not shown) to the chuck electrode 205 to electrostatically attract the semiconductor wafer 150 to the electrostatic attraction surface 207 of the dielectric layer 206, and the processing gas is supplied from the gas source 140 into the plasma processing chamber 110 via the mass flow controller 141 and the gas supply valve 142.

An electric field oscillated by the microwave source 101 and introduced into the processing chamber 110 via the waveguide 103, the dielectric window 111, and the shower plate 112 generates an interaction with a magnetic field formed by the magnetic field generation coil 104, dissociates the processing gas supplied into the processing chamber 110, and generates plasma in the processing chamber 110. The etching processing is performed on the semiconductor wafer 150 adsorbed on the electrostatic chuck 120 by the plasma of the processing gas thus formed.

At this time, the temperature of the semiconductor water 150 is controlled to a predetermined temperature by using the heater layer 203, the flow path 204, and the like included in the electrostatic chuck 120.

OTHER EMBODIMENTS

In the first embodiment, the insulating layer 202 is an insulating layer made of ceramics formed by thermal spraying, but in the electrostatic chuck according to the embodiment of the present invention, the insulating layer may be formed by molding a sintered body. In this case, the insulating layer is fixed to the upper surface of the metal substrate with an adhesive layer, made of an epoxy resin-based adhesive, a silicone resin-based adhesive, or the like, interposed therebetween.

In the electrostatic chuck according to the embodiment of the present invention, the heater layer and the flow path (refrigerant groove) are not essential but may be provided as necessary.

The plasma method applicable to the plasma processing apparatus according to the embodiment of the present invention is not limited to the microwave electron cyclotron resonance (ECR) plasma method, and other plasma methods such as a capacitively-coupled plasma method and an inductively-coupled plasma method can also be applied.

The processing apparatus according to the embodiment of the present invention is not limited to the plasma etching apparatus but may be another processing apparatus such as an ashing apparatus or a film forming apparatus.

In the embodiment of the present invention, the workpiece is not limited to the semiconductor wafer but may be, for example, a glass substrate for LCD or the like.

[Evaluation Test]

In the electrostatic chuck according to the embodiment of the present invention, the electrostatic attraction surface has excellent corrosion resistance. In order to show this, the following evaluation test was performed.

Test Example 1

In the present test example, test pieces subjected to various thermal spraying and sealing treatments were formed and subjected to a test of exposure to a plasma etching atmosphere (hereinafter, also referred to as an exposure test). In the present test example, a change in strain amount until cracking occurs due to bending deformation of the test piece was evaluated.

(1) Test Substrate

Titanium (TP340) was used as a test substrate, and a plurality of substrate pieces having dimensions of 16 mm wide×100 mm long×4 mm thick were prepared from this substrate.

(2) Formation of Spray Coating and Sealing Treatment

On one surface of each substrate piece, alumina-10 wt % titania powder was sprayed using atmospheric plasma spraying to form a ceramic spray coating having a thickness of 0.3 mm. Next, the various sealing treatments were performed on the ceramic spray coating. The sealing treatment was performed by the following two methods (sealing treatments A and B).

Sealing treatment A: A mixed solution containing 55 wt % of turpentine oil, 15 wt % of yttrium 2-ethylhexanoate, and 30 wt % of acetic acid ester was applied and impregnated on the surface of the ceramic spray coating and was fired at 150° C. for two hours. In this way, a test piece (No. 1) was prepared in which the pores of the ceramic spray coating were filled with a sealing component containing yttrium 2-ethylhexanoate and a resin.

Sealing treatment B: A mixed solution containing 10 wt % of monomethyl triisocyanate silane and 90 wt % of acetic acid ester was applied and impregnated on the surface of the ceramic spray coating and was fired at 70° C. for six hours. In this way, a test piece (No. 2) was prepared in which the inside of pores of the ceramic spray coating were sealed with the silicone resin.

In addition, a test piece (No. 3) having a ceramic spray coating formed thereon and not subjected to the sealing treatment was also prepared.

(3) Test Method and Conditions Thereof

In order to investigate a change in strain amount until the test piece was cracked before and after being exposed to the plasma etching atmosphere, the test piece (No. 1 to No, 3) was exposed to the plasma etching atmosphere for 200 hours under the following conditions.

<Plasma etching conditions>
Ar gas flow rate: 60 ml/min
$NF_3$ gas flow rate: 750 ml/min
Pressure: 40 Pa
Discharge output: 1000 W Next, a strain gauge was bonded to the sprayed surface of each test piece before and after the exposure test, bending deformation was applied at 90°, and the strain amount at the time of occurrence of cracking was measured.

(4) Test Results

Figure 3:
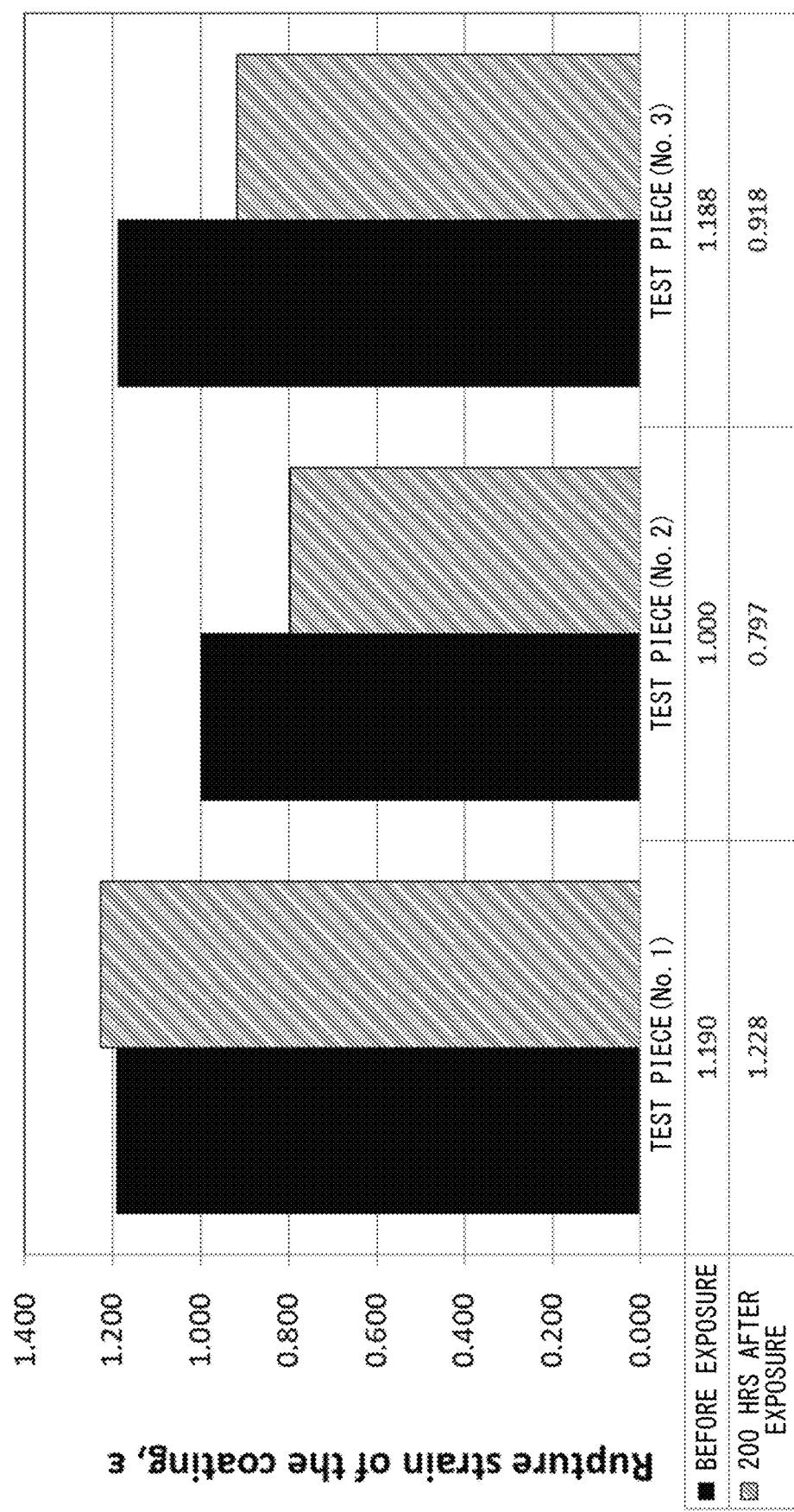
FIG. 3 is a graph showing measurement results of Test Example 1.

The test results are shown in FIG. 3. FIG. 3 is a graph showing measurement results of Test Example 1. Each numerical value in the table of FIG. 3 represents a relative value based on the strain amount before exposure of the test piece (No. 2).

In the test piece (No. 2) and the test piece (No. 3), the strain amount until cracking was significantly reduced after exposure to the plasma etching atmosphere.

On the other hand, in the test piece (No. 1), a change in strain amount until cracking was hardly observed after exposure to the plasma etching atmosphere.

Therefore, it has been confirmed that the ceramic spray coating in which the pores are filled with the sealing component containing yttrium 2-ethylhexanoate and the resin is suitable for preventing cracking as compared to other specifications.

Test Example 2

In the present test example, after various thermal spraying and sealing treatments were performed to form an electrostatic chuck for evaluation having the configuration shown in FIG. 2, an exposure test was performed in which the electrostatic chuck for evaluation was exposed to a plasma etching atmosphere, and (a) a cumulative discharge time until cracking occurred in the spray coating, (b) a cross-sectional X-ray photoelectron spectroscopy (XPS) analysis after the exposure test, and (c) an electron probe microanalysis (EPMA) after the exposure test were performed.

(1) Test Substrate

In the present Test Example, the test substrate was titanium (TP340).

(2) Formation of Spray Coating and Sealing Treatment

In the present test example, an alumina powder was sprayed as a first insulating layer on the substrate piece by using atmospheric plasma spraying to form a ceramic spray coating.

Then, as a heater layer, tungsten powder was sprayed on the first insulating layer by using atmospheric plasma spraying to form a tungsten spray coating.

Next, as a second insulating layer, alumina powder was sprayed on the heater layer and the first insulating layer by using atmospheric plasma spraying to form a ceramic spray coating.

Subsequently, as a chuck electrode layer, tungsten powder was sprayed on the second insulating layer by using atmospheric plasma spraying to form a tungsten spray coating.

Next, as a dielectric layer, alumina-10 wt % titania powder was sprayed using atmospheric plasma spraying to form a ceramic spray coating.

Then, various sealing treatments performed in Test Example 1 were applied to the dielectric layer for each region.

Through such processing, an electrostatic chuck 220 for evaluation (cf. FIG. 4(a)) was manufactured.

The electrostatic chuck 220 for evaluation has a region A in which the electrostatic attraction surface of the dielectric layer was subjected to the same sealing treatment as that of the test piece (No. 1) of Test Example 1, and a region B in which the electrostatic attraction surface of the dielectric layer was subjected to the same sealing treatment as that of the test piece (No. 2) of Test Example 1.

(3) Methods of Exposure Test

The electrostatic chuck 220 for evaluation was exposed to a plasma etching atmosphere under the following conditions. The heater layer of the electrostatic chuck 220 for evaluation was connected to a heater DC power source (not shown) and was repeatedly energized.

<Plasma etching conditions>

Ar gas flow rate: 60 ml/min $NF_3$ gas flow rate: 750 ml/min

Pressure: 40 Pa

Discharge output: 1000 W

Heater output: 1200 W (a) Cumulative Discharge Time to Cracking

Figure 4:
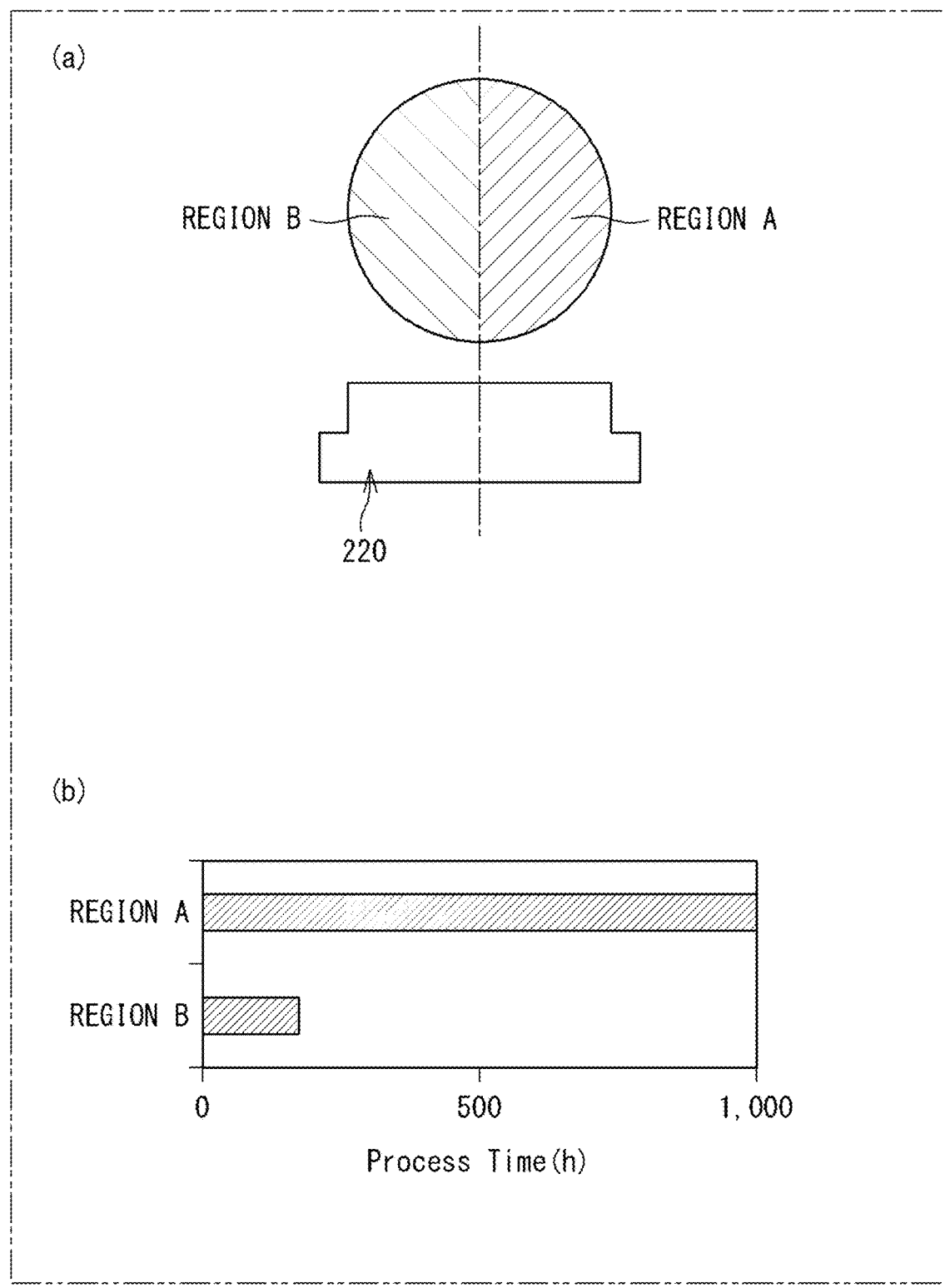
FIG. 4(a) is a view schematically showing an electrostatic chuck for evaluation produced in Test Example 2.
FIG. 4(b) is a graph showing a cumulative discharge time until cracking.

The measurement result of the cumulative discharge time is shown in FIG. 4.

FIG. 4(a) is a view schematically showing the electrostatic chuck 220 for evaluation prepared in Test Example 2, and FIG. 4(b) is a graph showing the cumulative discharge time until cracking measured in Test Example 2.

As shown in FIG. 4(b), cracking did not occur in the region A even after discharging for 1000 hours, but cracking occurred in the region B after discharging for 180 hours.

(b) Cross-Sectional XPS Analysis Result

A part of the electrostatic chuck for evaluation after the exposure test was cut, and the cross section XPS analysis of the ceramic spray coating portion was performed. The results are shown in FIG. 5.

FIG. 5(a) is an observation image of the cut surface of the region A after the exposure test, and FIG. 5(b) is a diagram showing the distribution of each component in the coating of the electrostatic chuck for evaluation measured in Test Example 2.

As the XPS analyzer, Quantera SXM manufactured by ULVAC-PHI, Inc. was used.

Figure 5:
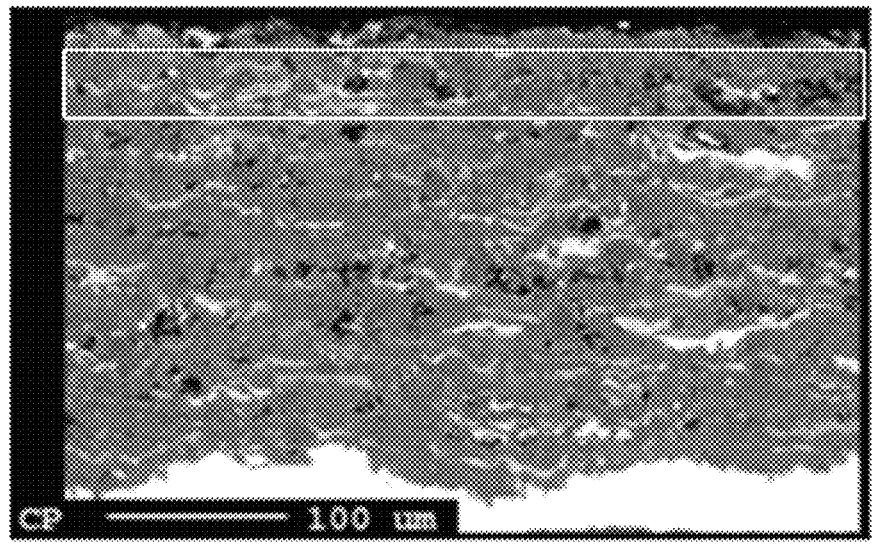
FIG. 5(a) is an observation image of a cut surface of a region A after an exposure test.
FIG. 5(b) is a diagram showing a distribution of each component in a coating of the electrostatic chuck for evaluation.
Figure 5:
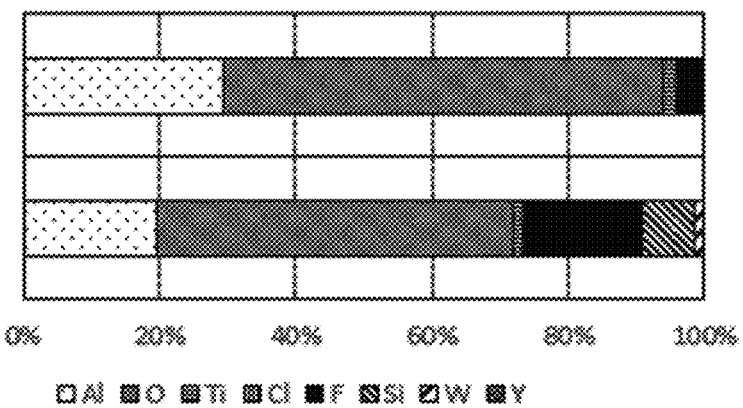

As shown in FIG. 5, it was confirmed that the amount of fluorine in the region A was smaller than that in the region B.

(c) Cross-Sectional EPMA Analysis Result

A part of the electrostatic chuck for evaluation after the exposure test was cut, and cross-section EPMA analysis near the surface of the ceramic spray coating was performed. The results are shown in FIG. 6.

FIG. 6(a) and FIG. 6(b) are diagrams showing the distribution of fluorine in the coating of the electrostatic chuck for evaluation measured in Test Example 2, in which FIG. 6(a) shows the analysis result of the region A, and FIG. 6(b) shows the analysis result of the region B. FIG. 6(a) and FIG. 6(b) are views in which color display is performed.

As an EPMA analyzer, JXA-8500 F manufactured by JEOL Ltd. was used.

Figure 6:
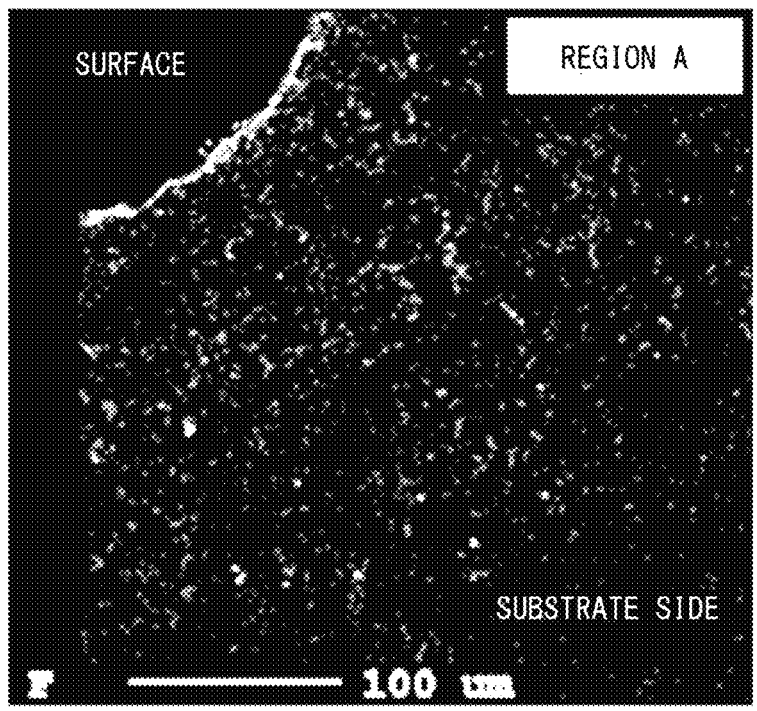
Figure 6:
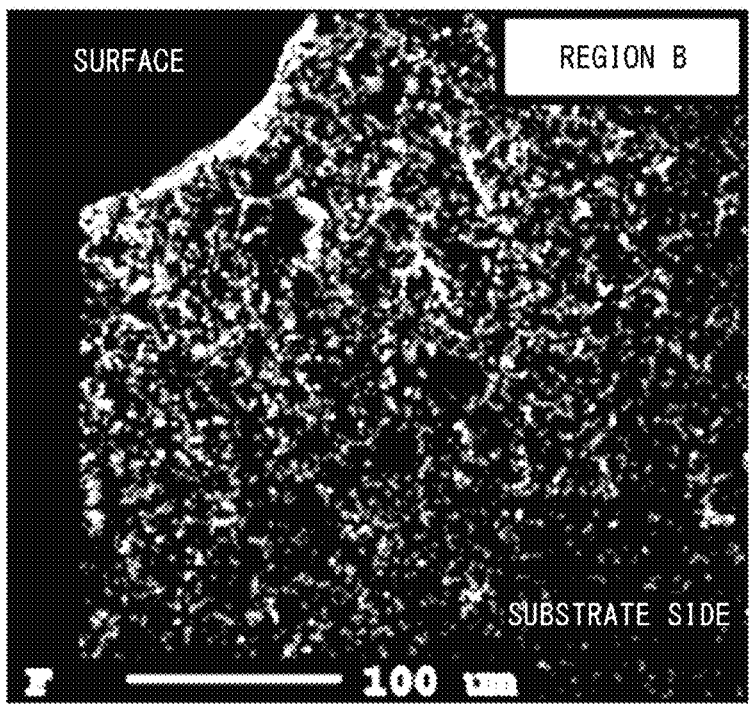

As shown in FIG. 6, it was confirmed that the amount of fluorine in the region A was smaller than that in the region B and that the permeation range front the surface was also narrow.

Test Example 3

In Test Example 3, the sealing component contained in the spray coating of the test piece (No. 1) prepared in Test Example 1 was analyzed.

First, the same sealing agent as used in Test Example 1 was placed in a crucible, fired at 150° C. for two hours, and solidified.

Next, the obtained solidified material was subjected to FT-IR analysis.

For FT-IR analysis. Fourier transform type infrared spectrometer 3100 manufactured by Agilent Technologies, Inc. was used.

Figure 7:
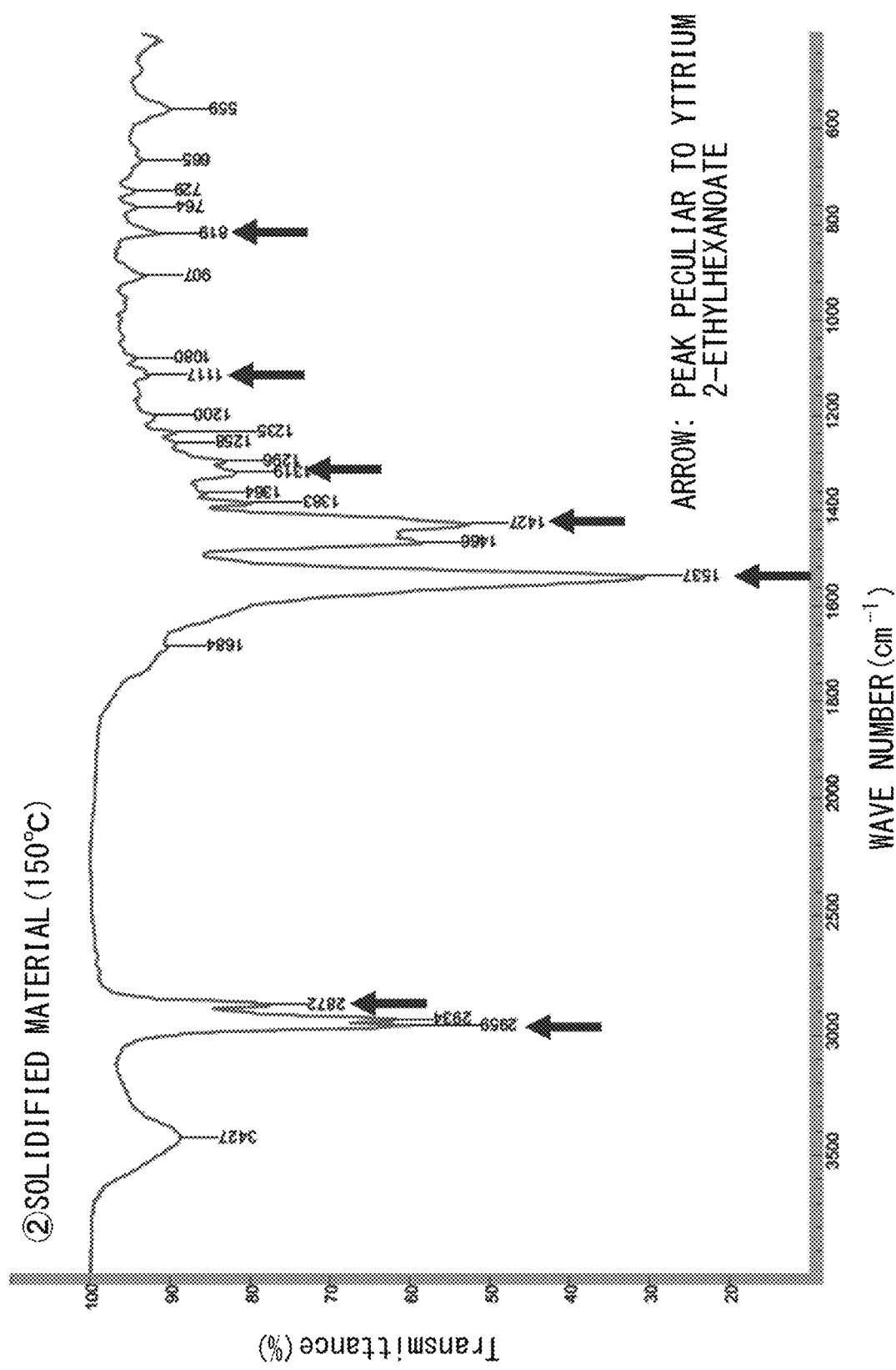
FIG. 7 is a graph showing a measurement result of Fourier-transform infrared spectroscopy (FT-IR) analysis performed in Test Example 3.

FIG. 7 is an IR spectrum obtained by FT-IR analysis.

This FT-IR analysis confirmed that the solidified material contained yttrium 2-ethylhexanoate.

Next, the solidified material obtained by firing at 150° C. for two hours was subjected to GC-MS analysis.

For GC-MS analysis, a gas chromatography mass spectrometer 5977A MSD manufactured by Agilent Technologies, Inc. was used. As a derivatization treatment, the solidified material was dissolved in a 5 wt % hydrochloric acid methanol solution by hermetic heating at 80° C. (holding for 18.5 hours) to perform methyl esterification.

Figure 8:
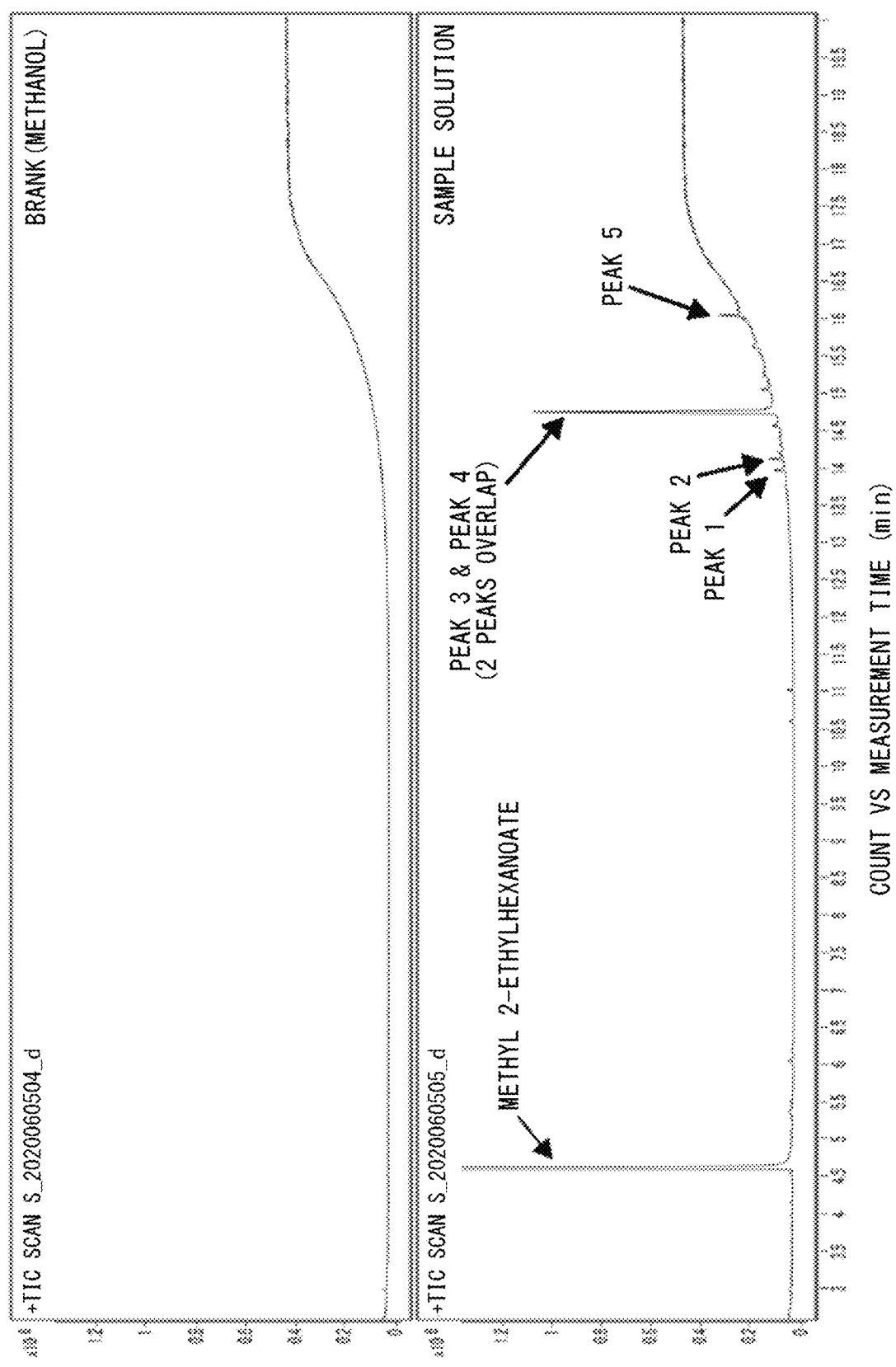
FIG. 8 is a chromatogram obtained by gas chromatography-mass spectrometry (GC-MS) analysis performed in Test Example 3.

FIG. 8 is a chromatogram obtained by GC-MS analysis.

Figure 9:
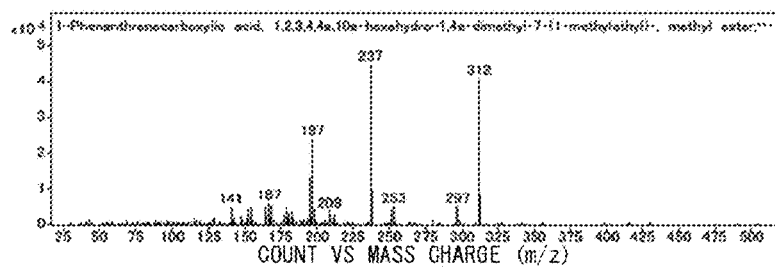
FIG. 9(a) and FIG. 9(b) are mass spectra of some of detection peaks detected in the chromatogram of FIG. 8, and FIG. 9(c) to FIG. 9(e) are database search results.
Figure 9:
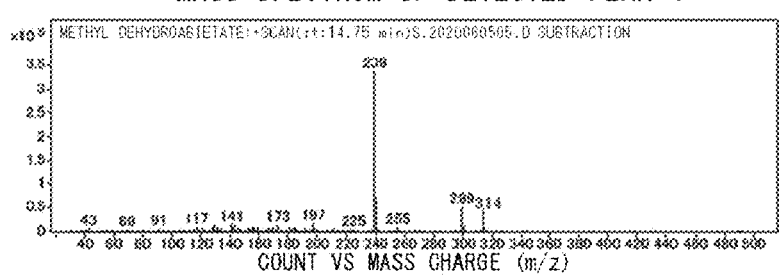
Figure 9:
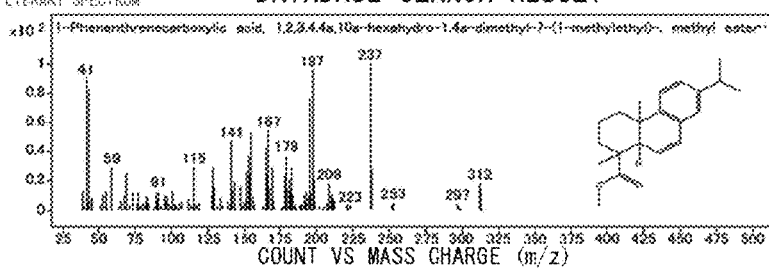
Figure 9:
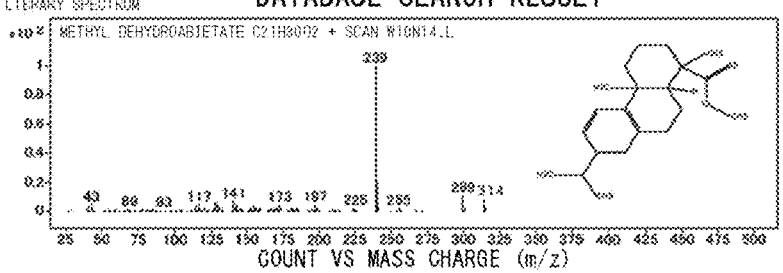
Figure 9:
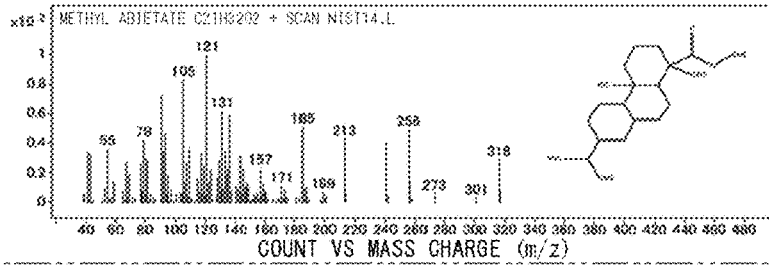

FIG. 9(a) and FIG. 9(h) are mass spectra of some (peak 3 and peak 4) of detection peaks detected in the chromatogram of FIG. 8, and FIG. 9(c) to FIG. 9(e) are database search results.

In this GC-MS analysis, it was confirmed that the solidified material contained ethylhexanoic acid and an abietic acid-related compound derived from turpentine oil.

Further, the sample (solidified material) was subjected to GC analysis by GC2010 manufactured by Shimadzu Corporation.

Here, as a column, DB-17 manufactured by Agilent Technologies was used. As a derivatization treatment, the solidified material was dissolved in a 5 wt % hydrochloric acid methanol solution by hermetic heating at 80° C. (holding for 18.5 hours) to perform methyl esterification.

Figure 10:
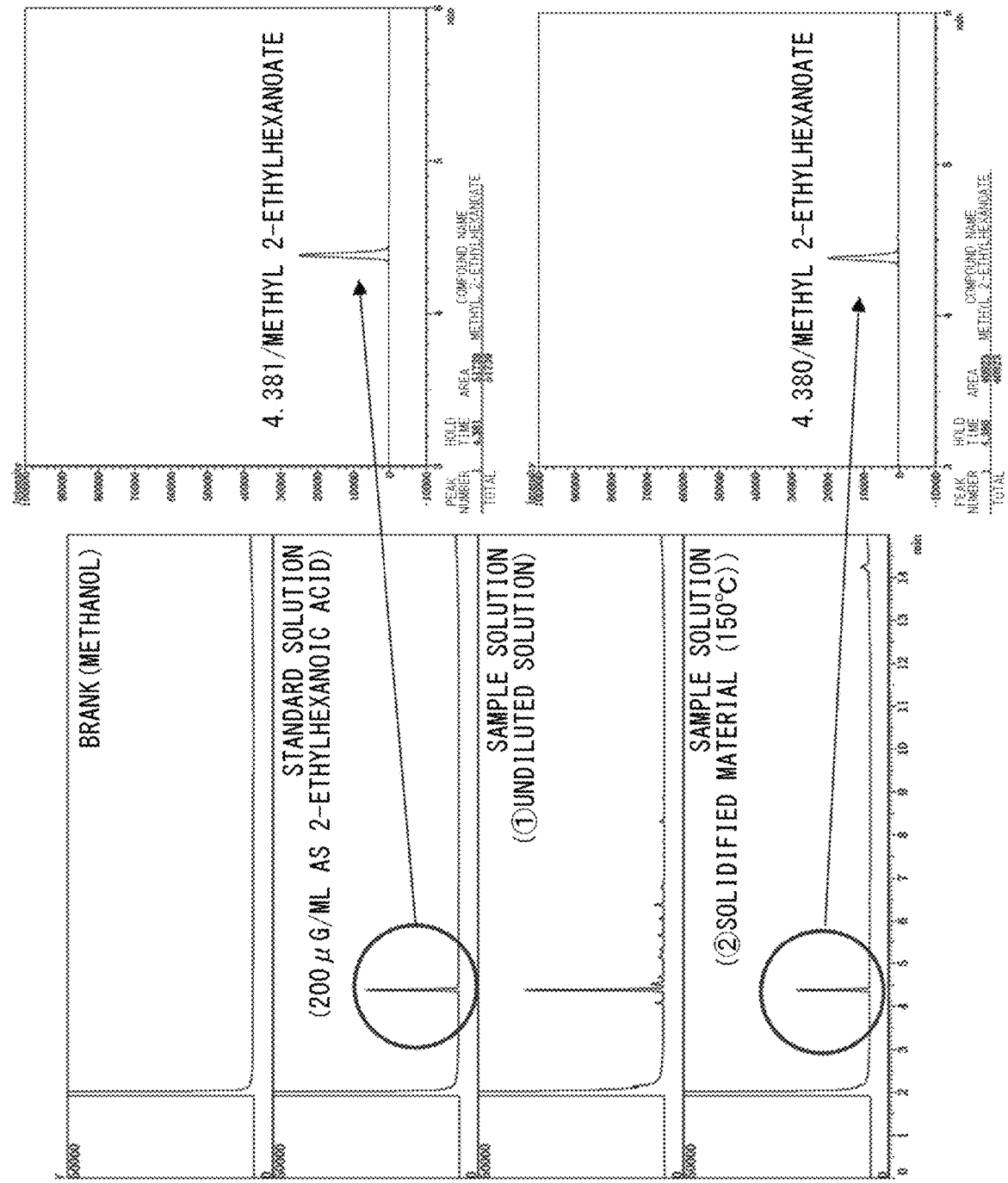
FIG. 10 is a chromatogram obtained by the GC analysis performed in Test Example 3.

FIG. 10 is a chromatogram obtained by GC analysis.

In this GC analysis, it was confirmed that the solidified material contained 41 wt % of 2-ethylhexanoic acid.

Next, the solidified material was subjected to inductively coupled plasma (ICP) analysis.

For ICP analysis, ICP AES 5110 VDV type manufactured by Agilent Technologies was used.

As a result, Y was detected in an amount of 13 wt %.

From the above, it was confirmed that the component of the solidified material was about 54 wt % of yttrium 2-ethylhexanoate and that the rest was a rosin substance mainly composed of an abietic acid-related compound.

REFERENCE SIGNS LIST 10 plasma pro processing apparatus
11 plasma formation part
12 vacuum vessel
13 exhaust system
101 microwave source
102 automatic matcher
103 waveguide
104 solenoid coil
110 plasma processing chamber
111 dielectric window
112 shower plate
113 gas ring (gas introduction part)

120 electrostatic chuck
121 RF power source
122 matching device
130 movable valve
131 TMP
140 gas source
141 mass flow controller
142 gas supply valve
150 (semiconductor) wafer
201 metal substrate
202 insulating layer
203 heater (heater layer)
204 flow path (refrigerant groove)
205 chuck electrode
206 dielectric layer
207 electrostatic attraction surface
220 electrostatic chuck for evaluation

The invention claimed is:

1. A Johnsen-Rahbek force type electrostatic chuck comprising:
a metal substrate;
an electrode for electrostatic attraction provided on the metal substrate with an insulating layer interposed between the metal substrate and the electrode for electrostatic attraction; and
a dielectric layer constituting an electrostatic attraction surface in contact with a workpiece,
wherein
the dielectric layer includes a ceramic spray coating and a sealing component with which pores of the ceramic spray coating are filled, and
the sealing component contains a metal organic salt containing a rare earth element.

2. The electrostatic chuck according to claim 1, wherein a volume resistivity of the ceramic spray coating is $1.0 \times 10^8$ to $1.0 \times 10^{13} \Omega \cdot cm$.

3. The electrostatic chuck according to claim 2, wherein the ceramic spray coating is made of aluminum-titanium oxide.

4. The electrostatic chuck according to claim 2, wherein the rare earth element is yttrium or ytterbium.

5. The electrostatic chuck according to claim 1, wherein the ceramic spray coating is made of aluminum-titanium oxide.

6. The electrostatic chuck according to claim 5, wherein the rare earth element is yttrium or ytterbium.

7. The electrostatic chuck according to claim 1, wherein the rare earth element is yttrium or ytterbium.

8. A processing apparatus comprising the electrostatic chuck according to claim 1.

* * * * *